(12) United States Patent
Barish

(10) Patent No.: US 12,333,216 B2
(45) Date of Patent: Jun. 17, 2025

(54) CONTAINER FULLNESS TRACKING METHOD AND SYSTEMS

(71) Applicant: ZEBRA TECHNOLOGIES CORPORATION, Lincolnshire, IL (US)

(72) Inventor: Justin F. Barish, Kings Park, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 209 days.

(21) Appl. No.: 17/395,073

(22) Filed: Aug. 5, 2021

(65) Prior Publication Data

US 2023/0044858 A1 Feb. 9, 2023

(51) Int. Cl.
*G06F 30/10* (2020.01)
(52) U.S. Cl.
CPC .................................... *G06F 30/10* (2020.01)
(58) Field of Classification Search
CPC ............................... G06F 30/10; G06Q 10/08
See application file for complete search history.

(56) References Cited

U.S. PATENT DOCUMENTS

| | | | | |
|---|---|---|---|---|
| 10,713,610 B2* | 7/2020 | Zhang | ........................ | G06T 7/12 |
| 10,867,275 B1* | 12/2020 | Dholakia | ............... | G06V 20/52 |
| 2016/0239790 A1 | 8/2016 | Burch, V et al. | | |
| 2018/0173239 A1* | 6/2018 | Yoon | .................... | G05D 1/0214 |
| 2018/0268348 A1* | 9/2018 | Guan | .................. | G06Q 10/083 |
| 2020/0334846 A1* | 10/2020 | Hageman | ............. | H04N 13/246 |
| 2020/0376670 A1* | 12/2020 | Diankov | ................ | B25J 9/1697 |
| 2021/0406566 A1 | 12/2021 | Shankar | | |

OTHER PUBLICATIONS

International Search Report and Written Opinion for International Application No. PCT/US2022/37444 mailed on Oct. 18, 2022.

\* cited by examiner

*Primary Examiner* — Rehana Perveen
*Assistant Examiner* — Troy A Maust

(57) ABSTRACT

A method includes: generating a three-dimensional grid of cells representing respective portions of an interior of a container, each cell having a status indicator defining an occupancy state of the corresponding portion of the container interior; during loading of the container: maintaining, for each of the cells, a current status indicator, controlling a depth sensor to capture a sequence of point clouds, each point cloud depicting the container interior, in response to each point cloud capture in the sequence, generating updated status indicators for the cells, based on (i) the point cloud, and on (ii) the current status indicators, replacing the current status indicators with the updated status indicators, measuring a current fullness of the container based on the current status indicators, and transmitting the current fullness to a computing device for at least one of display of the current fullness, or alert generation associated with the current fullness.

15 Claims, 13 Drawing Sheets

CONTAINER FULLNESS TRACKING METHOD AND SYSTEMS

BACKGROUND

Container fullness estimates can be used for scheduling, resource allocation, and the like in transport and logistics or other facilities where containers are loaded with items. Such fullness estimates may be generated at independent points in time, e.g. by capturing image or depth data depicting a container interior, and analyzing the data to determine a fullness estimate. However, under certain conditions, such estimates are inaccurate to a sufficient degree to interfere with the scheduling and/or resource allocation processes that rely on fullness estimates.

SUMMARY

In an embodiment, the present invention is a method, comprising: generating a three-dimensional grid of cells representing respective portions of an interior of a container, each cell having a status indicator defining an occupancy state of the corresponding portion of the container interior; during loading of the container: maintaining, for each of the cells, a current status indicator, controlling a depth sensor to capture a sequence of point clouds, each point cloud depicting the container interior, in response to each point cloud capture in the sequence, generating updated status indicators for the cells, based on (i) the point cloud, and on (ii) the current status indicators, replacing the current status indicators with the updated status indicators, measuring a current fullness of the container based on the current status indicators, and transmitting the current fullness to a computing device for at least one of display of the current fullness, or alert generation associated with the current fullness.

In another embodiment, the present invention is a system, comprising: a depth sensor having a field of view encompassing at least a portion of an interior of a container; and a computing device configured to: generate a three-dimensional grid of cells representing respective portions of an interior of the container, each cell having a status indicator defining an occupancy state of the corresponding portion of the container interior; during loading of the container: maintain, for each of the cells, a current status indicator, control a depth sensor to capture a sequence of point clouds, each point cloud depicting the container interior, in response to each point cloud capture in the sequence, generate updated status indicators for the cells, based on (i) the point cloud, and on (ii) the current status indicators, replace the current status indicators with the updated status indicators, measure a current fullness of the container based on the current status indicators, and transmit the current fullness to a further computing device for at least one of display of the current fullness, or alert generation associated with the current fullness.

In a further embodiment, the present invention is a non-transitory computer-readable medium storing instructions executable by a processor of a computing device to: generate a three-dimensional grid of cells representing respective portions of an interior of a container, each cell having a status indicator defining an occupancy state of the corresponding portion of the container interior; during loading of the container: maintain, for each of the cells, a current status indicator, control a depth sensor to capture a sequence of point clouds, each point cloud depicting the container interior, in response to each point cloud capture in the sequence, generate updated status indicators for the cells, based on (i) the point cloud, and on (ii) the current status indicators, replace the current status indicators with the updated status indicators, measure a current fullness of the container based on the current status indicators, and transmit the current fullness to a further computing device for at least one of display of the current fullness, or alert generation associated with the current fullness.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
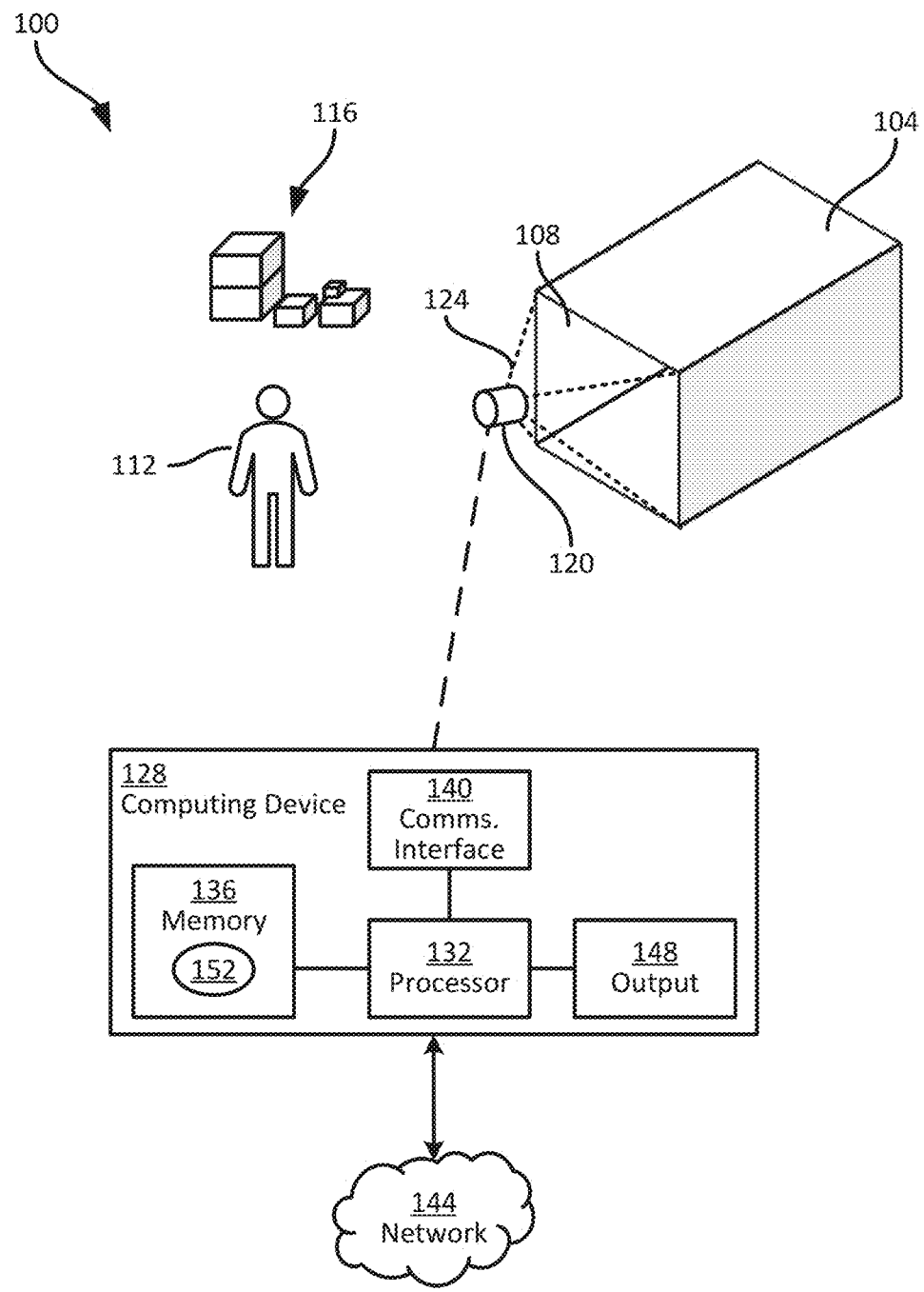
FIG. 1 is a diagram of a system for container fullness tracking.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

FIG. 1 illustrates a system 100 for tracking fullness of a container 104, such as a unit load device (ULD), trailer, shipping container, or the like. The container 104 includes a frame, set of walls, or the like, defining at least one opening 108 via which a worker 112, forklift (not shown) or the like can enter the container 104 to place items 116 therein. As will be apparent to those skilled in the art, the container 104 can be placed in a facility along with a plurality of other containers to be loaded in a similar manner. For example, each container 104 can be placed at a load bay, and removed from the load bay upon completion of container loading, to be replaced with a further container 104.

During the load process for a given container 104 (i.e. during the placement of items 116 into the container 104), the current fullness of the container 104 may be monitored. The fullness of the container 104 is a measure, e.g. as a percentage or other fraction, of what portion of the internal volume of the container 104 is occupied by items 116. The load process may have a target fullness, e.g. 90%, although a wide variety of other targets may also be employed, depending on scheduling requirements at the facility, the type(s) of the items 116, and the like. Monitoring the fullness of the container 104 throughout a load process may enable efficient allocation of resources in a facility in which multiple containers 104 are loaded. Such resources can include staffing (such as the worker 112), vehicles or other container-handling devices used to transport containers 104 to and from load bays, and the like.

To that end, the system 100 includes a sensor 120, such as a depth camera, supported at a load bay at which the container 104 is placed for loading. The sensor 120 can be supported by a frame, wall, or the like in the facility, or in some cases can be affixed to the container 104 itself. The sensor 120 can include other forms of depth sensor in other examples, such as a lidar sensor or the like.

The sensor 120 is supported such that a field of view (FOV) 124 of the sensor 120 is oriented towards the opening 108 of the container 104. As a result, the FOV 124 encompasses substantially all of the interior of the container 104. The fullness of the container 104 can therefore be assessed by processing data captured by the sensor 120 depicting the interior of the container 104. Such processing can be performed, as in the illustrated example, by a computing device 128, e.g. a server at the facility housing the container 104.

The computing device 128 includes a processor 132 (e.g. one or more central processing units (CPU), graphics processing units (GPU) or the like), coupled with a non-transitory computer-readable medium such as a memory 136. The memory 136 includes a suitable combination of volatile memory (e.g. random access memory, RAM) and non-volatile memory (e.g. hard disks, flash memory, and the like). The processor 132 and the memory 136 each include one or more integrated circuits (ICs). The computing device 128 also includes a communications interface 140 enabling the device 128 to communicate with other devices, including the sensor 120 and network infrastructure implementing a network 144 (e.g. a suitable local or wide-area network). The interface 140 can therefore include a suitable combination of hardware and firmware for communicating with the above-mentioned devices, e.g. including a universal serial bus (USB) controller for communicating with the sensor 120, and/or an Ethernet controller for communicating over the network 144.

The computing device 128 can also include an output 148, e.g. a display, speaker or the like, controllable by the processor 132 to present information to an operator of the computing device 128 and/or other entities (e.g. the worker 112).

The memory 136 stores a set of computer-readable instructions in the form of an application 152 executable by the processor 132. The processor 132 is configured, via execution of the application 152, to implement various functions for tracking the fullness of the container 104. The computing device 128 can implement the above-mentioned functionality for more than one load bay in some examples, and can therefore be connected to more than one sensor 120.

Figure 2:
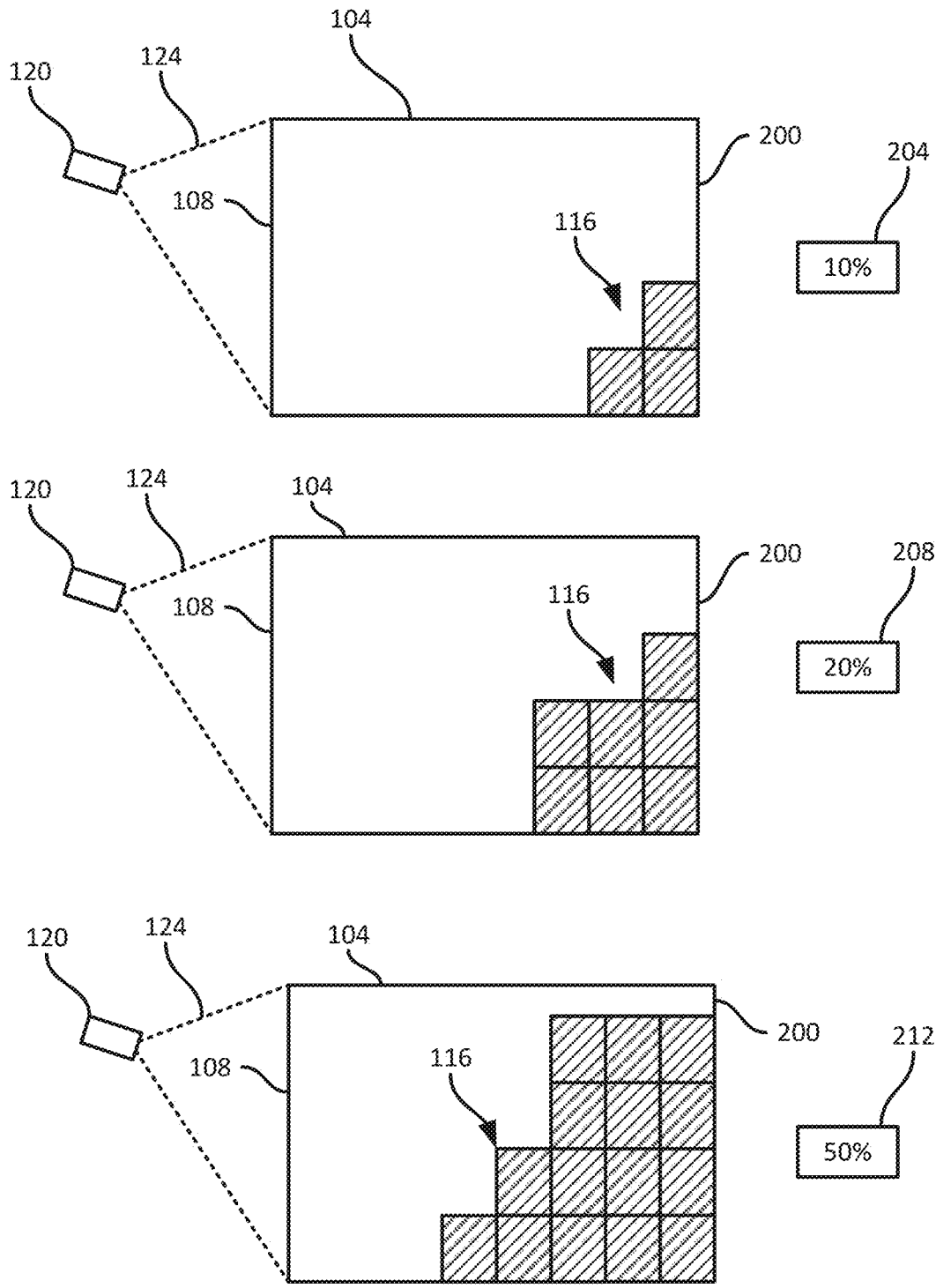
FIG. 2 is a diagram of a load process for a container.

Turning to FIG. 2, the container 104 is shown from the side, illustrating the interior thereof during a load process. In particular, from top to bottom, FIG. 2 shows the container 104 at three successive points in time during the load process, with a larger number of the items 116 having been placed in the container 104 at each point in time. In the illustrated load process, the container 104 is filled from a back 200 towards the forward opening 108. The fullness of the container 104 can be assessed by processing a single frame of data from the sensor 120 at each illustrated point in time, independently of the other points in time. By detecting the items 116 within the container, the computing device 128 can determine respective fullness measurements 204, 208, and 212 (of 10%, 20%, and 50%, respectively).

Figure 3:
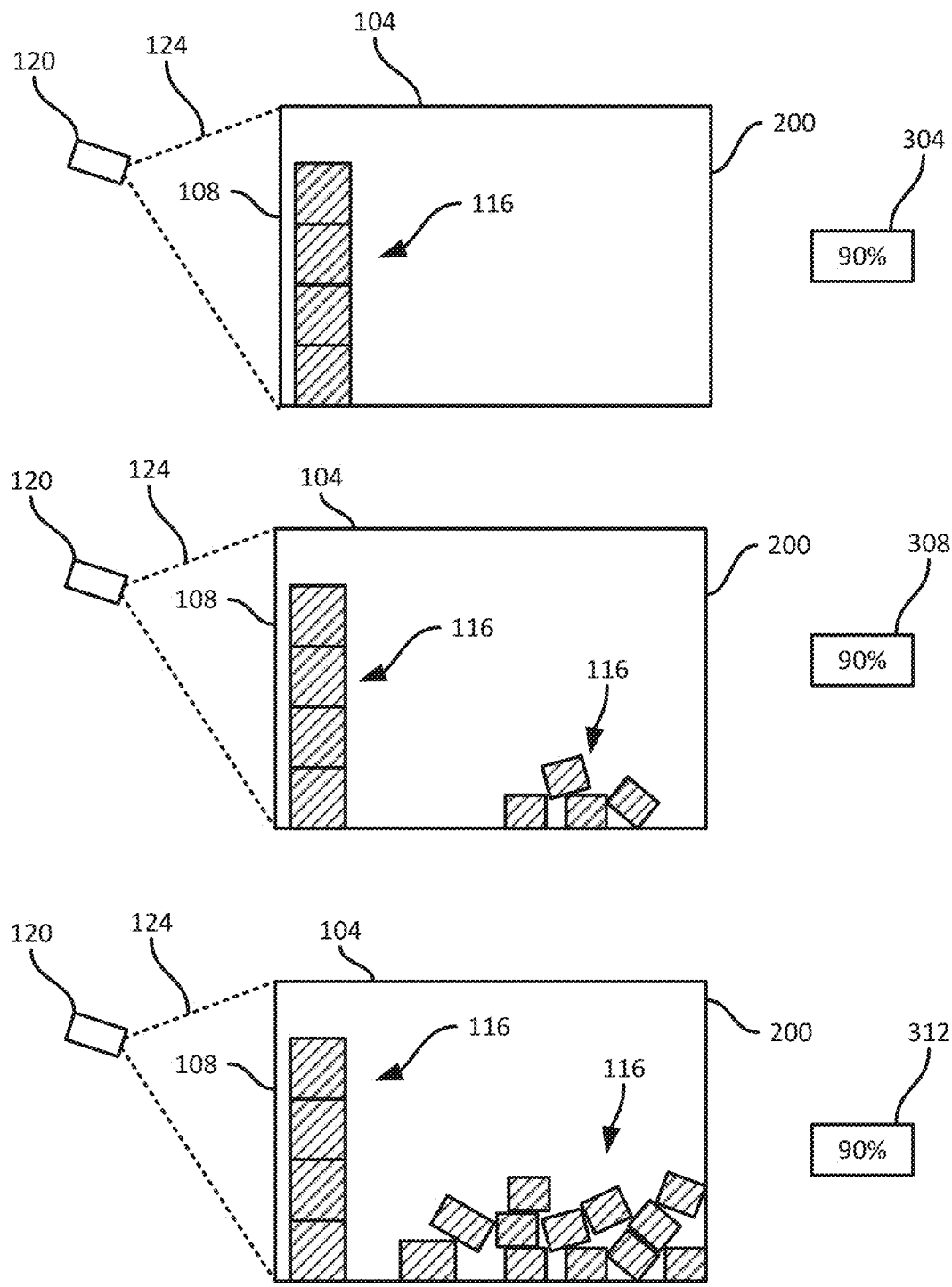
FIG. 3 is a diagram of a further load process for a container, illustrating an inaccurate fullness estimate under certain conditions.

In other examples, however, independent processing of frames of data from the sensor 120 may yield inaccurate fullness measurements, however. Turning to FIG. 3, in some examples the worker 112 may begin the load process by constructing a wall of items 116 at or near the forward opening 108 of the container 104, while the remainder of the container 104 is empty. As shown in the second and third stages of the load process illustrated in FIG. 3, the worker 112 may then deposit further items 116 into the container 104 behind that wall, e.g. by throwing the items 116 over the wall. The container 104 is therefore filled over time, but such filling is not visible to the sensor 120. That is, based on independent processing of frames of data from the sensor 120 as mentioned in connection with FIG. 2, fullness estimates 304, 308, and 312 of the container 104 appear unchanged (e.g. at about 90%) throughout the load process. The scheduling and resource allocation activities mentioned above may therefore be rendered less effective, in the absence of an accurate estimate of the fullness of the container 104.

The computing device 128 is therefore configured, as will be discussed below in greater detail, to generate fullness estimates for the container 104 throughout a load process based not only on a single current frame of data from the sensor 120, but also on previously determined fullness estimates. More specifically, the computing device 128 is configured, via execution of the application 152 by the processor 132, to maintain a three-dimensional representation of the interior of the container 104, e.g. a rectangular grid of cells. That three-dimensional representation is maintained persistently throughout the load process, and is incrementally updated based on successive frames of data captured by the sensor 120. As will be seen in the discussion below, this approach also enables the computing device 128 to infer the presence of items 116 under certain conditions, despite those items 116 being hidden from view to the sensor 120 (e.g. by other items 116).

Figure 4:
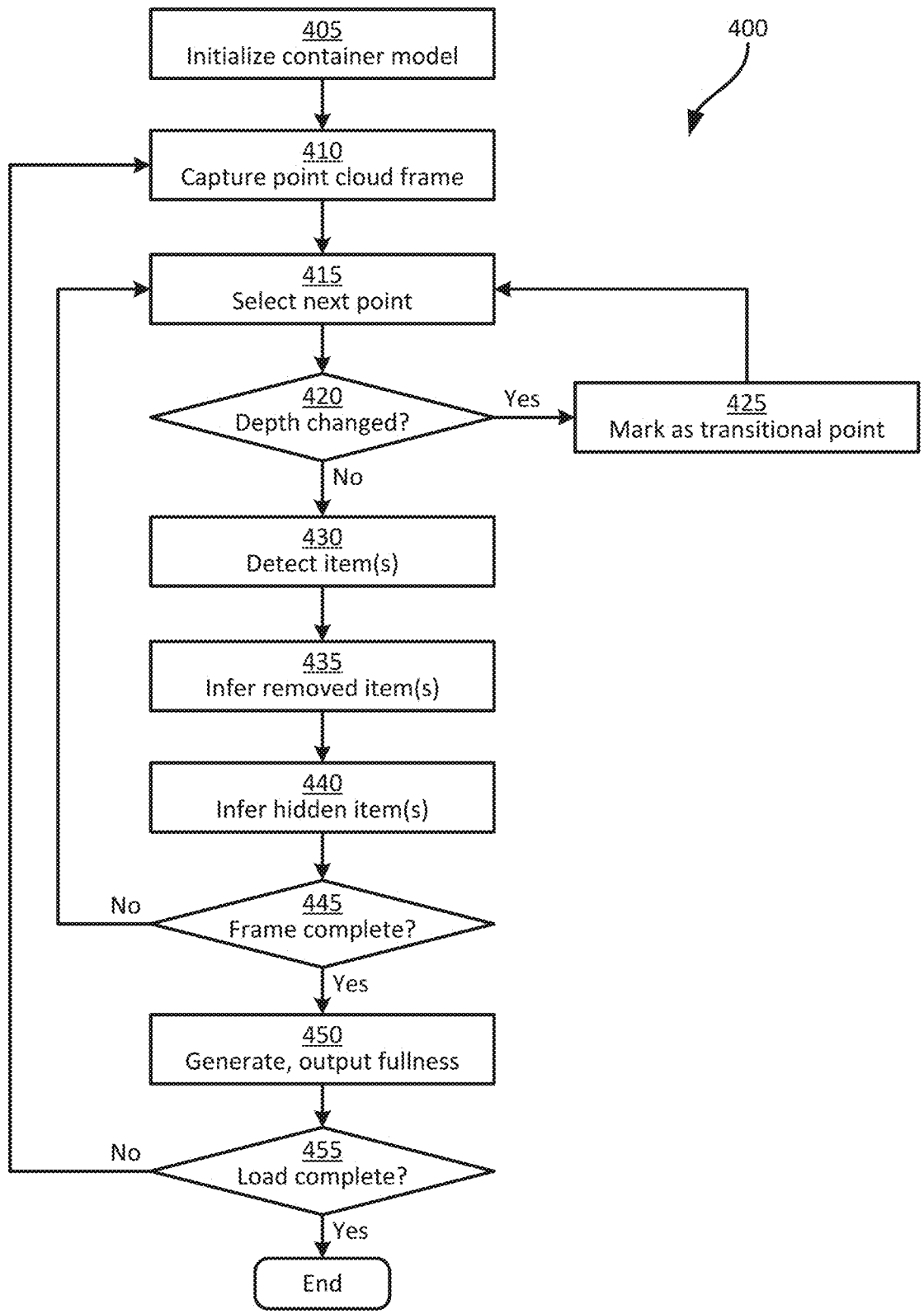
FIG. 4 is a flowchart of a method for container fullness tracking.

Turning to FIG. 4, a method 400 of container fullness tracking is illustrated. The method 400 is described below in conjunction with its performance in the system 100, and particularly by the computing device 128 via execution of the application 152. It is also contemplated, however, that the method 400 can be performed in other systems and/or by other computing devices than those shown in FIG. 1.

Figure 5:
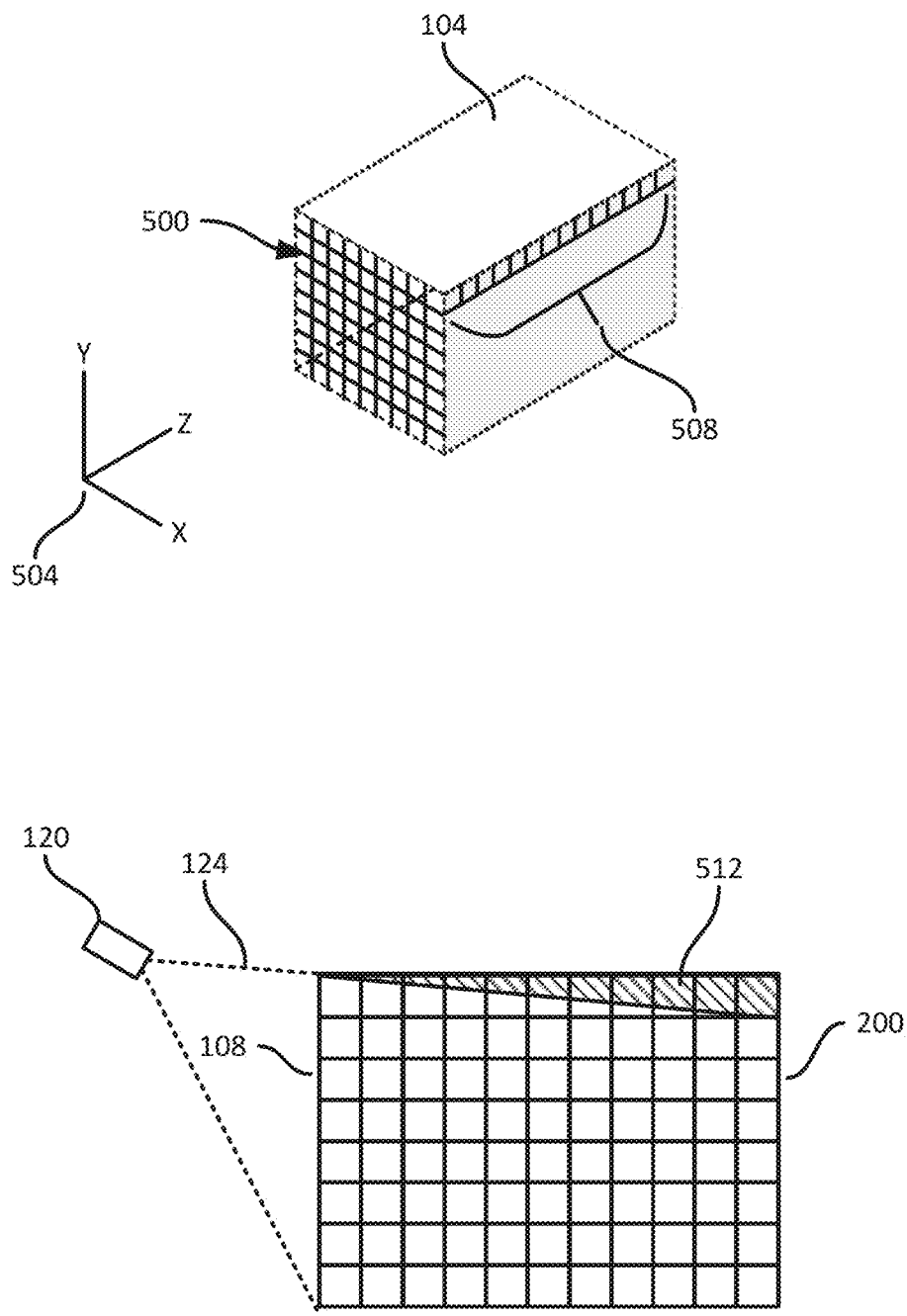
FIG. 5 is a diagram illustrating initialization of a model of a container at block 405 of the method of FIG. 4.

At block 405, the computing device 128 is configured to initialize a model of the container 104. The model can be, as noted above, a three-dimensional grid, e.g. of cube-shaped cells. An example model 500 is shown in FIG. 5, containing a number of cubic cells arranged according to a model coordinate system 504. Thus, the position of each cell in the model 500 is defined by transverse or cross-sectional coordinates X and Y (defining the position of the cell within a given depth-wise slice of the model 500), and a depth Z of the cell (defining which depth-wise slice of the model 500 contains the cell). Each X, Y pairing in the coordinate system 504 thus corresponds to a depth-wise stack 508 of cells extending from the front 108 of the container 104 to the back 200 of the container 104.

Initializing the model 500 at block 405 can include determining dimensions of the container 104, e.g. from the sensor 120 or from input (e.g. by the worker 112). The extent of the model 500 is then set to fill the interior space of the container 104. In some examples, the computing device 128 stores models in the memory 136 corresponding to each of a set of container types. At block 405, in such examples, the computing device 128 can receive input (or automatically detect, e.g. via the sensor 120 or another sensor such as a barcode scanner configured to read a label on the container 104) specifying the type of container 104. The computing device 128 can then load the corresponding model from the memory 136.

The model has a resolution selected based at least in part on a resolution of the sensor 120. For example, the side length for each cell in the model can be selected as half of the distance between points generated by the sensor 120 at the back 200 of the container 104. Various other mechanisms may also be employed to set a resolution of the model 500. In general, the cells of the model 500 are significantly smaller than the items 116, such as that any individual cell is unlikely to correspond to space within the container 104 that is only partially filled by an item 116.

Each cell in the model 500 has a status indicator that defines an occupancy state of the corresponding portion of the interior of the container 104. The state indicators therefore include a filled indicator (meaning that the corresponding portion of the container 104 has an item 116 therein), and an empty indicator. At the beginning of a load process, for example, all the cells in the model 500 can be set to the empty state.

In some examples, at block 405 the computing device 128 can mark certain cells as occluded. The occluded status indicator indicates that the relevant cell is not visible to the sensor 120, e.g. because the FOV 124 is interrupted by the frame of the container 104. For example, as shown in the lower portion of FIG. 5, a shaded portion 512 of the container 104 is not visible to the sensor 120. At least some of the cells within the portion 512 (e.g. the cells that are less than 50% visible to the sensor 120) can be marked as occluded. Cells with the occluded status indicator may be set to the filled state under certain conditions, as will be discussed below.

Returning to FIG. 4, at block 410 the computing device 128 is configured to control the sensor 120 to capture a frame of point cloud data. As will be apparent in the discussion below, the sensor 120 is controlled throughout the load process to capture frames of point cloud data at a suitable interval. In some examples, the interval is once per ten seconds, although less frequent and more frequent captures can also be employed.

The frame captured at block 410 includes depth values for each of a grid of pixels, e.g. identified by x, y coordinates. As will be apparent to those skilled in the art, each x, y pair corresponds to a ray extending from the sensor 120, and the depth value associated with that x, y pair indicates the distance from the sensor 120 to the nearest object along that ray. The relative positions of the sensor 120 and the container 104 (and by extension, the model 500) are assumed to be known, and therefore the trio of x, y, and depth for a given pixel in the frame captured at block 410 can be matched to one of the cells of the model 500.

The computing device 128 is then configured to process the frame captured at block 410. At block 415, the computing device 128 is configured to select a point from the frame for processing. The points captured at block 410 can be processed in various orders, e.g. beginning at a corner of the frame (e.g. with x, y, coordinates 0, 0).

Although the method 400 is intended to track the fullness of the container 104 as items 116 are loaded into the container 104, in some instances the frame captured at block 410 may depict not only placed items 116 within the container 104, but also artifacts such as the worker 112 (who must move into and out of the container 104 to load the items 116), staged items 116 that are in the container 104 but not in their final positions, and the like. Therefore, to reduce the likelihood of erroneous fullness estimates, the computing device 128 can be configured to determine whether a point in the captured frame is indicates an object in a transitional state, as opposed to an item 116 that is likely in its final position within the container 104.

Figure 6:
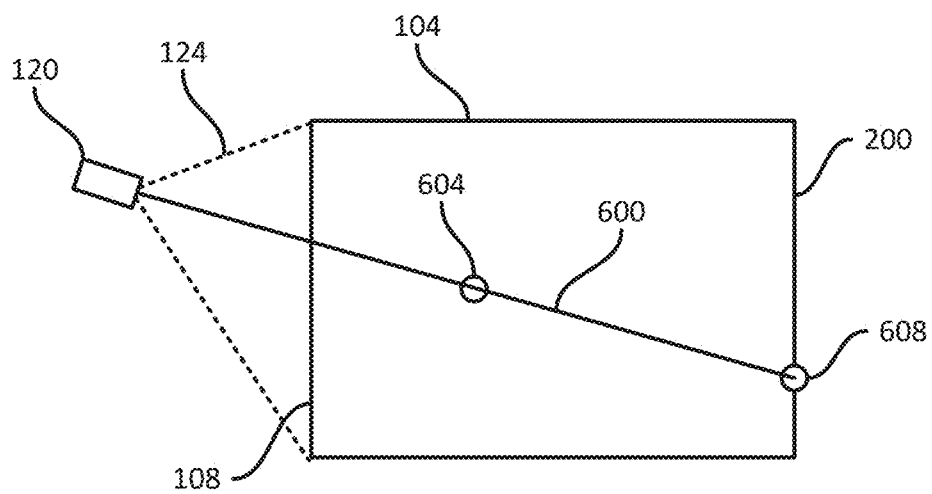
FIG. 6 illustrates an example performance of block 420 of the method of FIG. 4.

Specifically, at block 420, the computing device 128 is configured to determine whether the depth of the point selected at block 415 is different from the depth of that point in the previous frame (i.e. the depth at the same x, y, coordinates from the preceding performance of block 410). FIG. 6 illustrates an example performance of block 420, in which the determination is affirmative. In particular, a ray 600 extending from the sensor 120 corresponds to a given x, y pair of coordinates in the frame captured at block 410. A point 604 represents the current depth along that ray. That is, the point 604 is the point selected for processing at block 415. A previous point 608 indicates the previous depth associated with the ray 600 (i.e. with the same x, y coordinates). As shown in FIG. 6, the points 604 and 608 are at different depths, and the determination at block 420 is affirmative. The difference in depths may be caused by placement of an item 116 in the container 104, but may also be caused by the worker 112 entering the container 104, or the like.

When the determination at block 420 is affirmative, at block 425 the computing device 128 is configured to mark the x, y coordinates of the sensor 120 associated with the point as having a transitional state. In other words, in the example of FIG. 6, the ray 600 is marked as transitional. The computing device 128 is configured not to update the status indicators of the model 500 using transitional points, and the performance of the method 400 therefore returns to block 415.

When the determination at block 420 is negative (i.e. when the depth of the point selected at block 415 is the same, or within a configurable threshold, as the depth of the point on the same ray from the preceding frame), the computing device 128 proceeds to block 430. At block 430, the computing device 128 is configured to detect the presence of one or more items 116 based on the selected point. In general, the existence of a non-transitional depth measurement between the sensor 120 and the back 200 of the container 104 indicates the likely presence of an item 116. However, the sensor 120 is likely to capture only a portion of the item 116 (e.g. only the forward surface and/or the top surface of the item 116). Therefore, the computing device 128 is configured to set not only the cell corresponding to the point selected at block 415 to a filled state, but also certain additional cells that are spatially associated with that cell. A more detailed discussion of the performance of block 430 will be provided further below.

Following the performance of block 430, at which certain cells of the model 500 are set to the filled state to reflect the likely presence of items 116 that are visible to the sensor 120, at block 435 the computing device 128 can be configured to infer that items 116 have been removed from certain positions in the container 104. Cells corresponding to those positions are then set to an empty state (from a previous filled state). As will be discussed in detail further below, if the point from block 415 corresponds to a cell in the model 500 that is "behind" a previously filled cell (i.e. further from the sensor 120 along the same ray), the previously filled cell is unlikely to still contain an item 116 as that item 116 would have concealed the currently selected point. Therefore, the computing device 128 may infer that the previously represented item 116 is no longer present.

At block 440, the computing device 128 is configured to infer the presence of items 116 that are hidden from view by the sensor 120, e.g. by other items 116. Hidden items 116 may be behind items 116 closer to the front 108 of the container 104, and/or in the occluded spaces mentioned in connection with FIG. 5. As with blocks 430 and 435, the performance of block 440 will be discussed in detail further below.

At block 445, the computing device 128 is configured to determine whether processing of the current frame is complete. That is, the computing device 128 determines whether any points remain to be selected at block 415. When the determination at block 445 is negative, the performance of the method 400 returns to block 415, and the steps above are repeated for any remaining points. When the determination at block 445 is affirmative, at block 450 the computing device 128 is configured to generate a fullness estimate for the container 104 based on the current state of the model 500.

The generation of a fullness estimate at block 450 is performed by determining a ratio of the filled cells in the model 500 to the total internal volume of the container 104. For example, the computing device 128 can determine a number of cells set to the filled state, and divide that number by the total number of cells in the model 500. In other examples, the computing device 128 can determine a volume represented by the cells set to the filled state, based on the volume of each cell (known from model initialization at block 405) and number of cells set to the filled state. The filled volume can then be divided by a total internal volume of the container 104, e.g. received as input from the worker 112 or previously stored in the memory 136 by container type.

The fullness estimate can also be output at block 450, e.g. via the output device 148 of the computing device 128 itself, and/or by transmission to one or more other computing devices via the network 144. Such further computing devices can be configured to display the current fullness and/or generate one or more alerts relating to the fullness of the container 104.

At block 455, the computing device 128 is configured to determine whether the load process is complete. Completion may be indicated via input data received at the computing device 128 from the worker 112 or another computing device via the network 144. In some examples, the computing device 128 can determine that the load process is complete when the fullness estimate reaches a predefined threshold. When the determination at block 455 is negative, the computing device 128 controls the sensor 120 to capture another frame of point cloud data at block 410, and a further fullness estimate is generated, by updating the model 500 according to the preceding state of the model 500 and the newly captured frame. When the determination at block 455 is affirmative, the performance of the method 400 ends.

Figure 7:
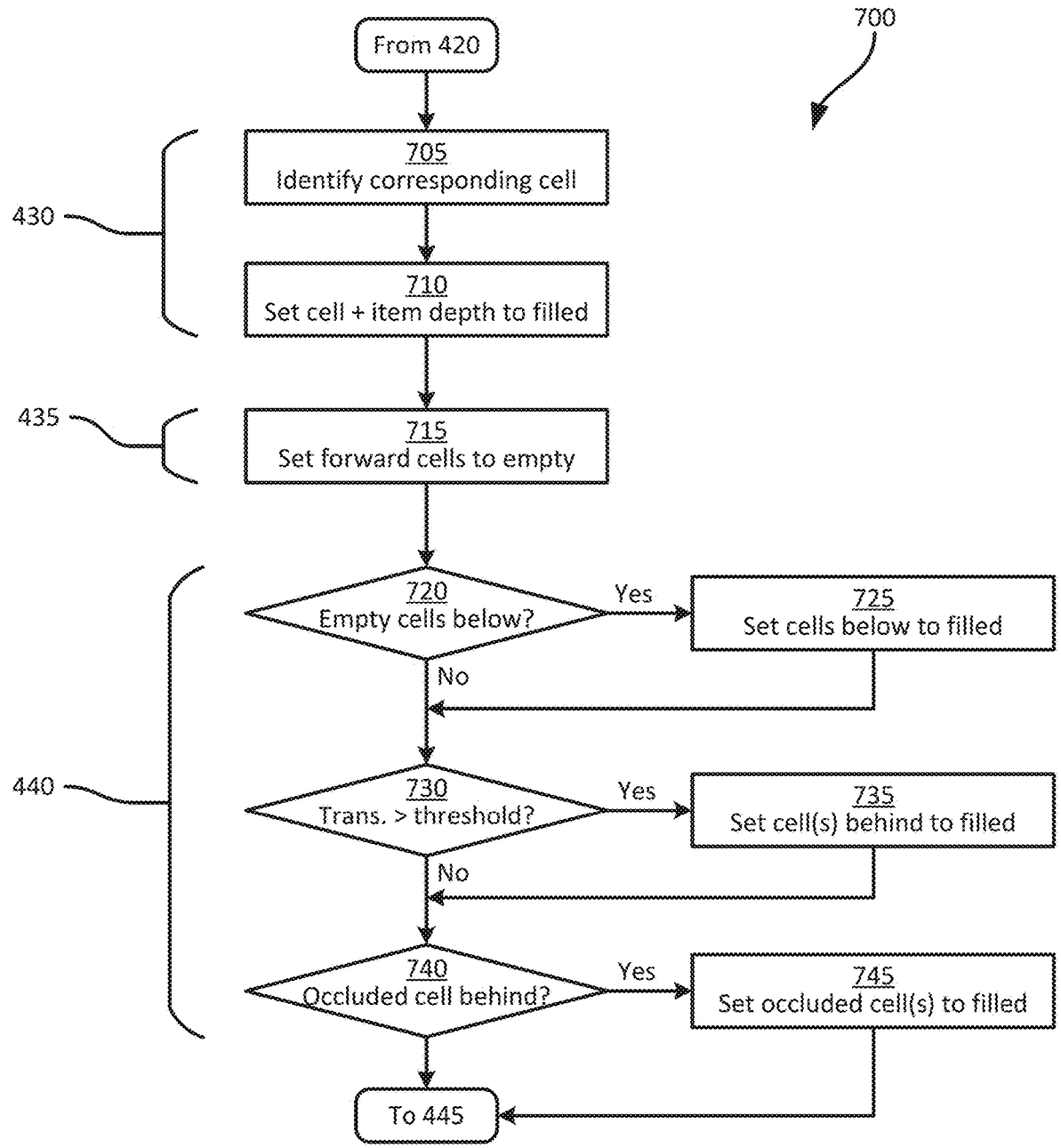
FIG. 7 illustrates a flowchart of a method for performing blocks 430, 435, and 440 of the method of FIG. 4.

Turning now to FIG. 7, a method 700 of performing item detection in the method 400 is illustrated. In particular, the method 700 defines an example process for implementing blocks 430, 435, and 440 as shown in FIG. 4. At block 705, the computing device 128 is configured to identify one of the cells of the model 500 that corresponds to the point selected at block 415. As will be apparent, each x, y coordinate pair of the sensor 120 defines a ray traversing a number of cells (which are not necessarily in the same stack 508, dependent on the position of the sensor 120 relative to the container 104, and on the shape of the FOV 124). The depth associated with the point from block 415 defines which cell along that ray corresponds to the point.

At block 710, the computing device 128 is configured to set the cell identified at block 705 to a filled state, as well as a predefined number of cells having the same X, Y coordinates in the system 504, and adjacent Z coordinates. In other words, the predefined number of cells defines an assumed item depth (e.g. an average box depth for items 116 handled in the facility in which the container 104 is loaded). Rather than assume that the entire volume behind a point visible to the sensor 120 is full, the computing device 128 employs the predefined item depth to assume that only a certain portion of the volume behind a visible point is full.

Figure 8:
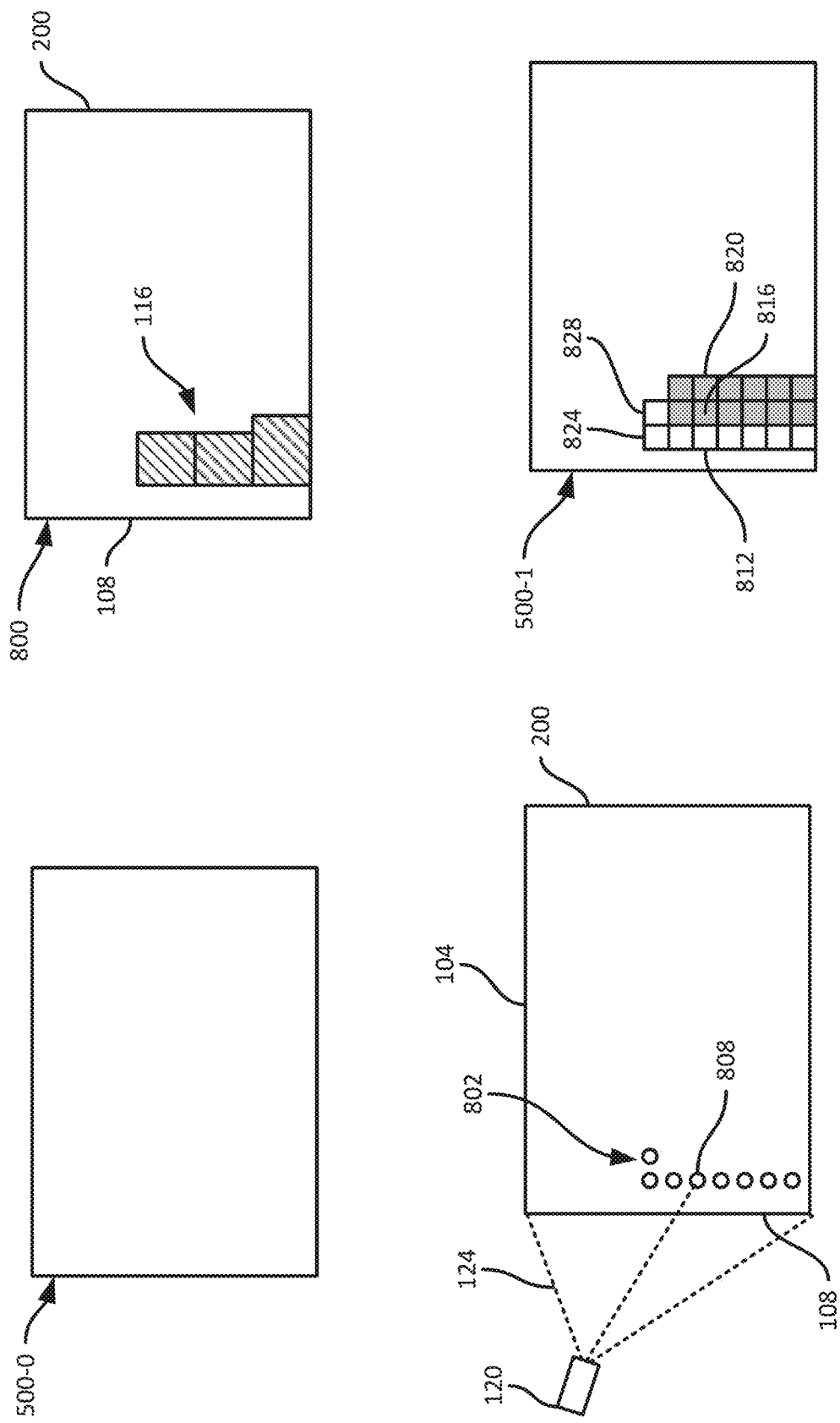
FIG. 8 illustrates an example performance of block 710 of the method of FIG. 7.

FIG. 8 illustrates an example performance of blocks 705 and 710. In particular, the model 500 is assumed to initially be in the state 500-0, with all cells set as empty. A current state 800 of the container 104 is illustrated, showing that three items 116 have been placed in a wall near the front 108 of the container 104. A set of points 802 (omitting the points that define the walls of the container 104) indicates the portions of the items 116 that are represented in the frame captured at block 410. For example, at block 705, having previously selected the point 808 for processing, the computing device 128 determines that the cell 812 corresponds to the point 808. That is, the cell 812 occupies the same (or a sufficiently similar) volume as the point 808 within the container 104. Therefore, at block 710, the computing device 128 sets the cell 812 to a filled state, as well as setting the cells 816 and 820 to a filled state. The same process, repeated for the other points in the set 820, yields an updated model 500-1. As seen in the model 500-1, the items 116 are represented with a predefined depth that may not match the true item depth exactly, but does not assume that the entirety of the container 104 behind the items 116 is full. In some examples, the setting of cells behind a cell identified at block 705 to a filled state can be omitted for cells with contiguous neighboring cells already set to a filled state. Such cells likely represent the top of an item 116, and are therefore likely to accurately represent the true depth of the item 116.

Returning to FIG. 7, at block 715 the computing device 128 can be configured to determine whether any cells between the cell identified at block 705 and the sensor 120 (i.e. on the same ray as the cell from block 705) are currently set to a filled state. If there are any such cells, the computing device 128 sets those cells to an empty state at block 715, because in order for the cell from block 705 to be visible, such cells must no longer contain any objects.

Figure 9:
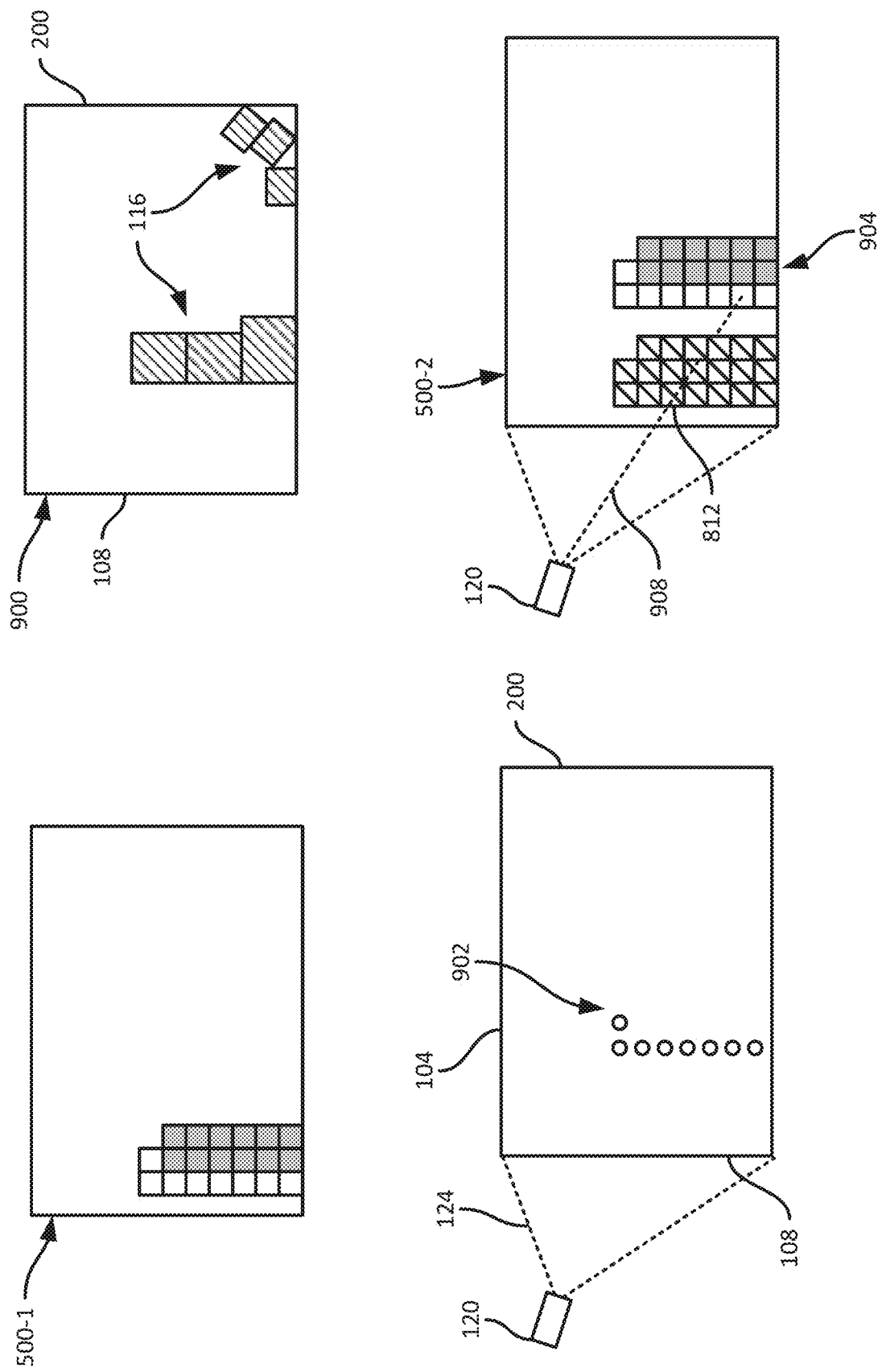
FIG. 9 illustrates an example performance of block 715 of the method of FIG. 7.

Turning to FIG. 9, a later stage in the loading process initiated in FIG. 8 is shown, in which the original wall of items 116 (represented in the model 500-1) has been shifted towards the back 200 of the container 104, as shown in the current state 900 of the container 104. Some items 116 have also been thrown behind the wall, but are not visible to the sensor 120. A set 902 of points indicates the data in a further frame captured by the sensor 120. A group 904 of cells are updated as discussed above in connection with blocks 705 and 710. Further, at block 715 the computing device 128 determines that the cell 812 (as well as all the other filled cells in the model 500-1, in this example) lies on a ray 908 between one of the cells 904 and the sensor 120. In order for the cells 904 to be visible to the sensor, it is assumed that the items 116 that led to the cell 812 being set to a filled state are no longer present. The cell 812, and the other cells from the model 500-1, are therefore reverted to an empty state, as indicated by the diagonal strikes through those cells. The model 500-1 is therefore replaced with an updated model 500-2, as shown in FIG. 9.

Referring again to FIG. 7, the computing device 128 can then be configured to determine whether any cells having been set to a filled state indicate the likely presence of hidden objects below those cells. Specifically, it is assumed that items 116 in the container 104 do not float, and therefore at block 720, the computing device 128 determines whether the current model 500 contains empty cells below the cell from block 705 (i.e. having the same X and Z coordinates in the system 504 as the cell from block 705, but a smaller Y coordinate). When the determination is affirmative, at block 725 the computing device 128 sets those cells to a filled state. The determination at block 720 can also be made with respect to cells set to filled at block 710 based on the predefined item depth (i.e. block 720 is not limited only to the cell from block 705). Further, in some examples each point may be processed via blocks 705 to 715, and then each cell modified through such processing may be processed via blocks 720 and onwards.

Figure 10:
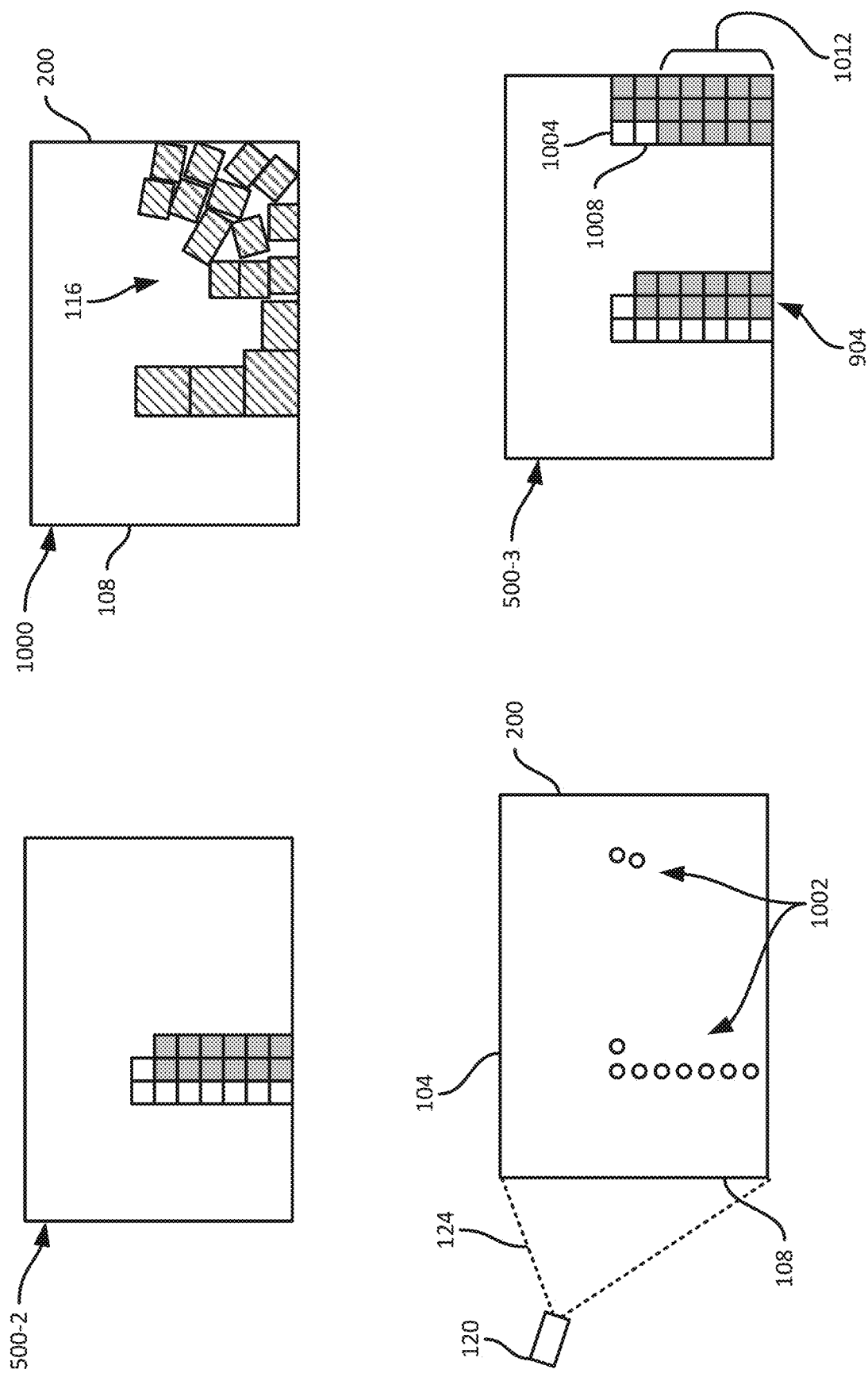
FIG. 10 illustrates an example performance of block 725 of the method of FIG. 7.

FIG. 10 illustrates an example performance of blocks 720 and 725, following further loading of the container 104 and capture of a further frame by the sensor 102. In particular, the model 500-2 is shown, as well as a current state 1000 of the container 104. As seen in FIG. 10, enough items 116 have been thrown behind the forward wall of items 116 that some of the thrown items are visible to the sensor 120. A set 1002 of points indicates the extent of the items 116 visible to the sensor 120.

Cells 1004 and 1008, as well as the cells behind them (i.e. in the same stacks 508), are set to filled via blocks 705 and 710. At block 720, the computing device 128 determines that the cells below the cells 1008, as well as the cells directly behind the cell 1008, are empty (as seen in the model 500-2), and therefore sets that group of cells 1012 to a filled state. As will now be apparent, although the updated model 500-3 does not contain a complete representation of the items 116 in the container 104, as additional items are piled behind the forward wall shown in FIGS. 8-10, the top of such piles of items 116 will become visible to the sensor 120, and result in filling of the entire regions below the tops. In other words, while the model 500 may lag actual fullness of the container 104, the lag is eventually recovered, and until such recovery, the fullness estimates produced by the computing device do not significantly overstate the actual fullness of the container 104 as a result of the forward wall of items 116.

Returning to FIG. 7, at block 730 the computing device 128 can be configured to determine whether the cell from block 705 was obstructed for a threshold period of time. Obstruction is determined by tracking whether the corresponding ray of the sensor 120 (i.e. the corresponding x, y coordinates used to identify the cell at block 705) have been marked as transitional (at block 425 of the method 400) for at least a threshold number of frames. For example, the determination can be affirmative at block 730 if the relevant ray has been marked as transitional for at least the preceding ten frames captured via block 410. Various other thresholds can be applied (e.g. for at least ten of the preceding twelve frames, etc.). The determination at block 730, in other words, seeks to identify cells of the model 500 that have been concealed from view by a moving object (e.g. the worker 112) for a threshold period of time or longer).

When the determination at block 730 is affirmative, at block 735 the computing device 128 is configured to set the cell from block 705 and all empty cells behind that cell (i.e. along the same ray of the sensor 120) to a filled state. This action reflects an assumption that a lengthy obstruction likely indicates that the worker 112 has filled the area no longer visible behind the cell from block 705.

Figure 11:
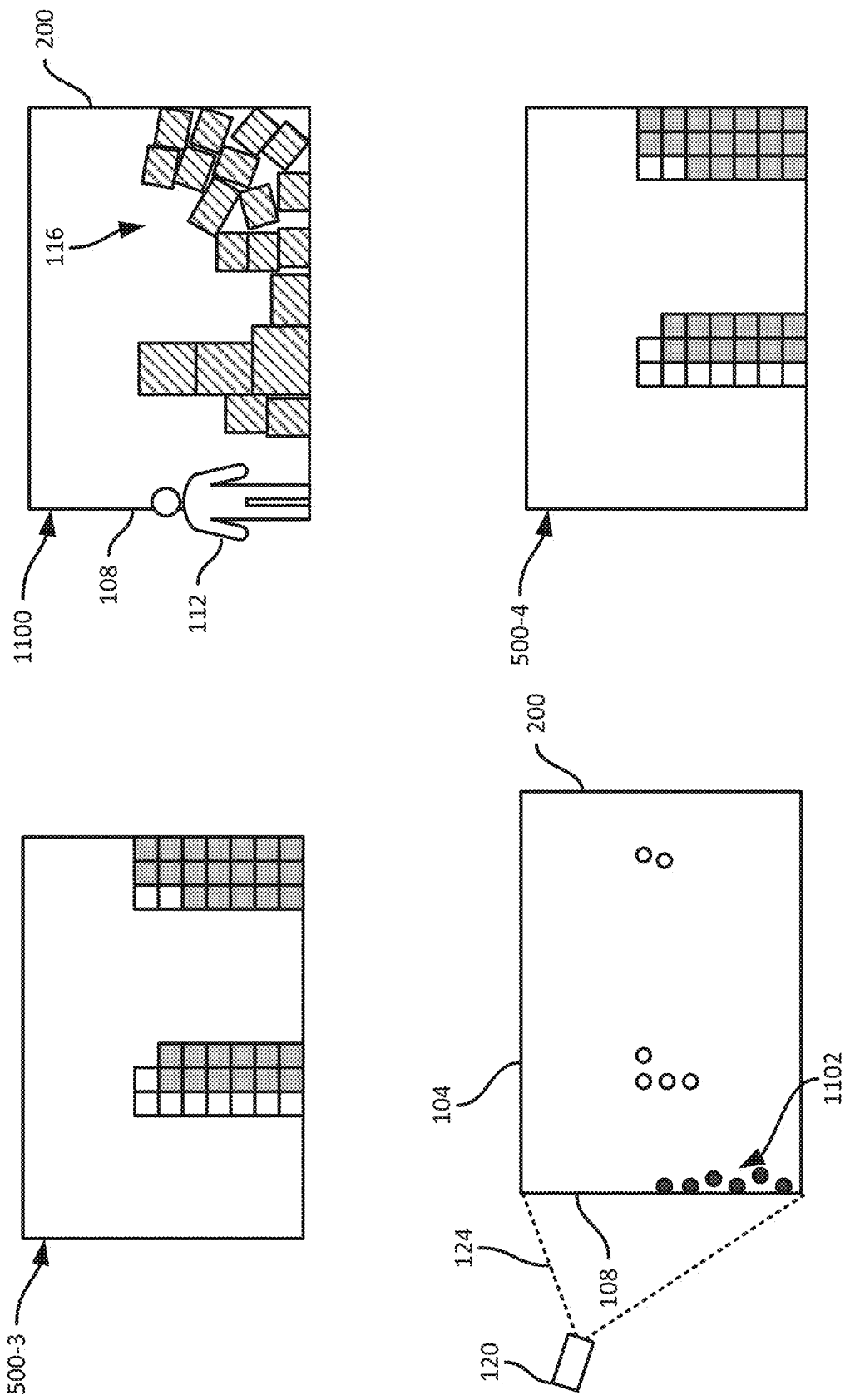
FIG. 11 illustrates an example performance of the method 400 while the container is partially obstructed by a moving worker.
Figure 12:
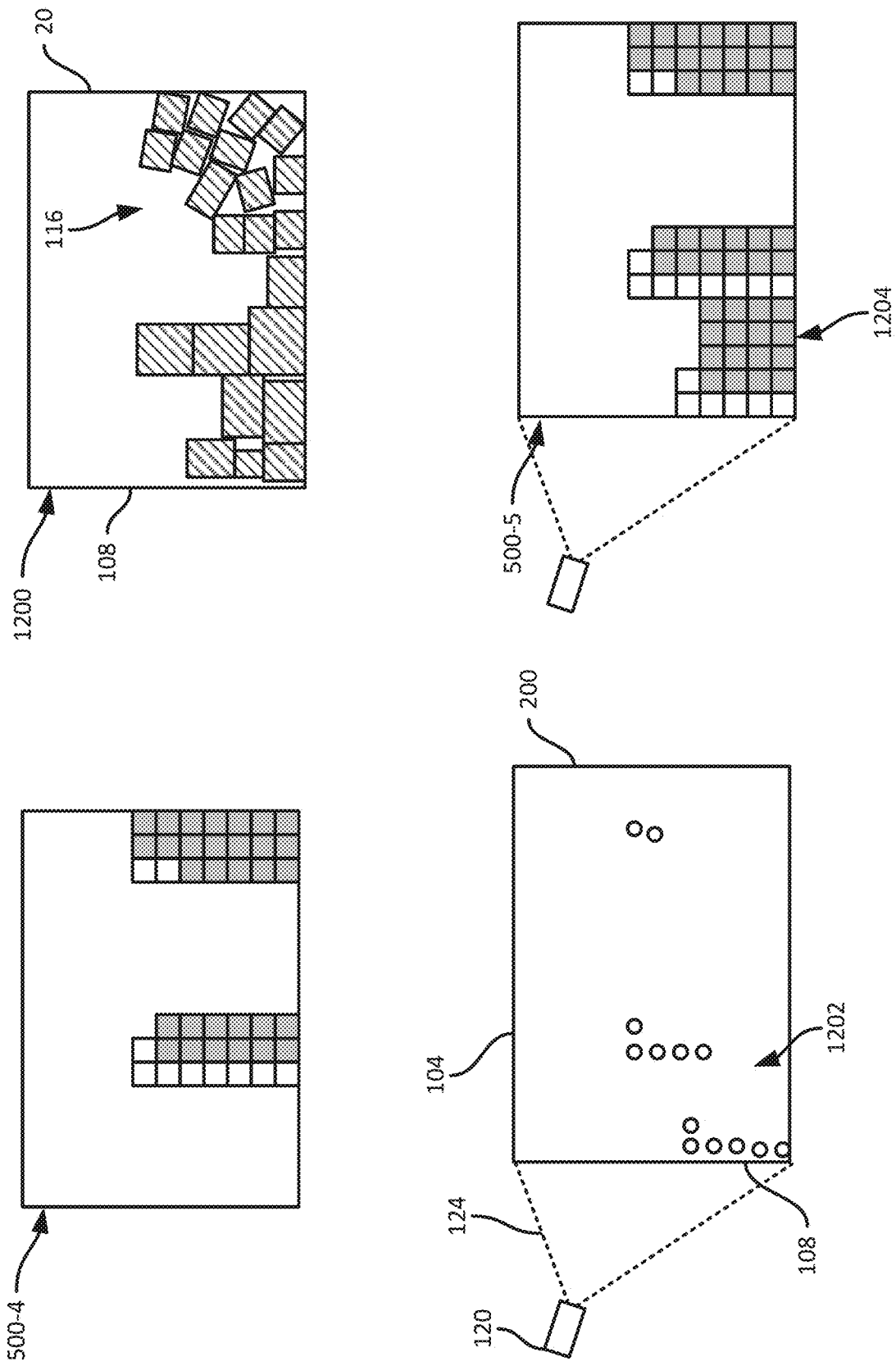
FIG. 12 illustrates an example performance of block 735 of the method of FIG. 7.

FIGS. 11 and 12 illustrate an example performance of blocks 730 and 735. Specifically, FIG. 11 illustrates a further state 1100 of the container 104, in which additional items 116 have begun to be placed near the front 108 of the container 104, but are obstructed by the worker 112. The worker 112 is represented by a set of points 1102 marked as transitional, and therefore not used to update the model. The model version 500-4 is therefore the same as the model version 500-3.

In FIG. 12, the current state 1200 of the container 104 shows that additional items 116 have been placed near the front of the container 104, concealing those shown in FIG. 11 from view to the sensor 120. A set of points 1202 depicts the portions of the items 116 visible to the sensor 120. Although the performance of block 710 for the cells corresponding to the foremost ones of the points 1202 will result in partial filling of the region that has actually been filled, the region that has been filled has a greater depth than the predefined item depth mentioned above. However, because it is assumed that the worker 112 remained in front of that region for a sufficient time period (e.g. multiple frames have elapsed between FIGS. 11 and 12), at block 735 the computing device sets a group 1204 of cells to a filled state, regardless of depth. As shown in the updated model 500-5, the block of shaded cells (indicating cells that do not correspond to the points 1202, but were nevertheless set to a filled state) extends further along the Z axis of the system 504 than the predefined item depth of three cells shown, for instance, in FIG. 8.

Returning again to FIG. 7, the computing device 128 can also set occluded cells (i.e. those not visible to the sensor 120 as a result of the frame of the container 104, as shown in FIG. 5) to a filled state under certain conditions. Specifically, at block 740, the computing device 128 can determine whether the cell identified at block 705 (or any other cell modified through block 710 for the current frame captured by the sensor 120) has occluded cells behind it. That is, the determination at block 740 is a determination of whether there are cells with the same X, Y coordinates (in the system 504) as the cell from block 705, and a greater Z coordinate. When the determination at block 740 is affirmative, any such occluded cells are set to filled at block 745, regardless of depth. In other words, the computing device 128 is configured to assume that if an item 116 is observed in front of an occluded region in the container 104, the occluded region is likely to have been filled as well.

Figure 13:
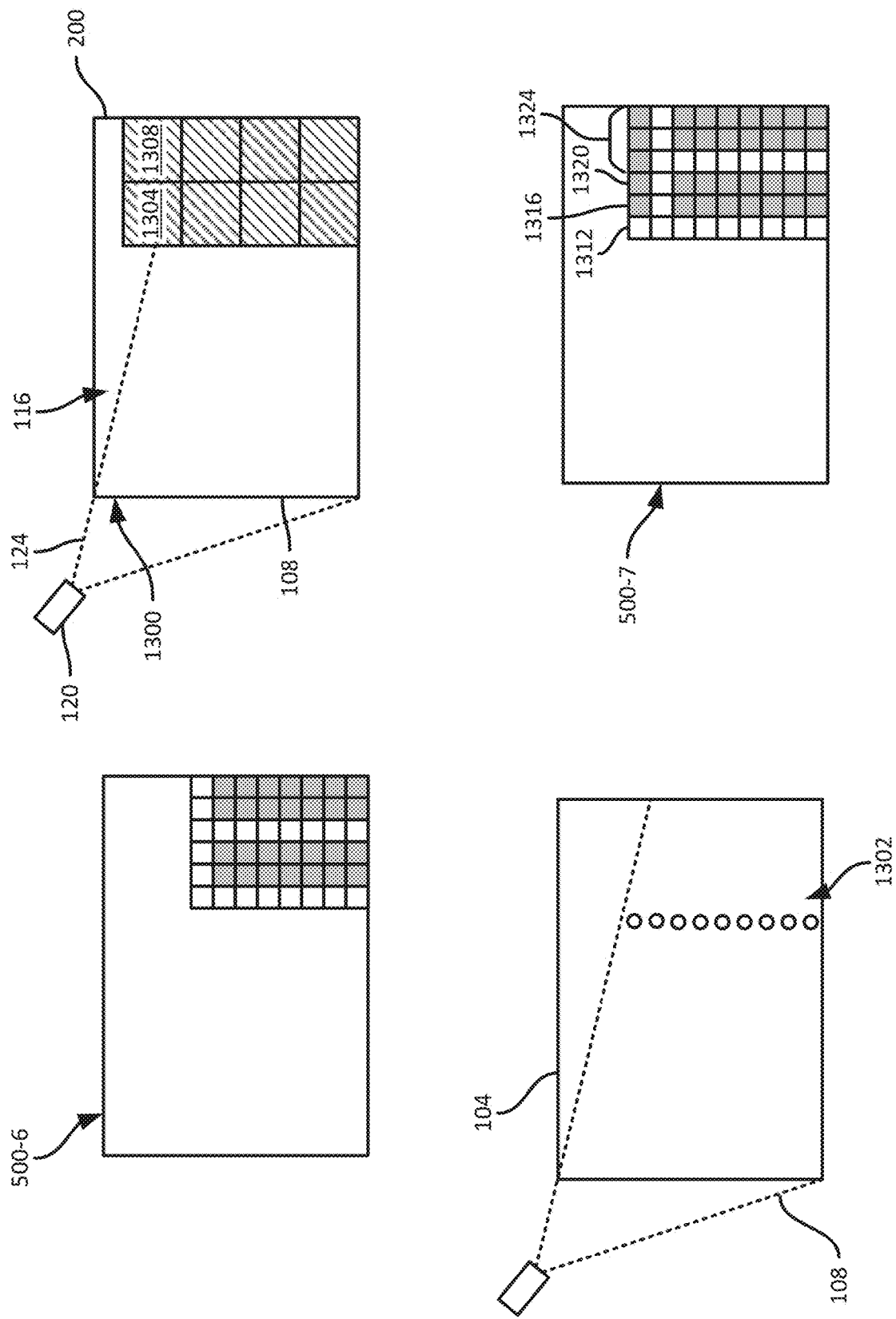
FIG. 13 illustrates an example performance of block 745 of the method of FIG. 7.

FIG. 13 illustrates a performance of blocks 740 and 745. In particular, a model 500-6 illustrates a previously detected stack of items 116 near the back 108 of the container 104. A current state 1300 of the container 104 indicates that additional items 1304 and 1308 have been placed on the stack. However, as visible in the top-right portion of FIG.

13, the sensor 120 is positioned such that the FOV 124 only encompasses a portion of the item 1304, and little or none of the item 1308 (even if the item 1304 were absent). The sensor 120 captures a frame containing a set of points 1302 depicting a portion of the stack of items 116, and as a result a cell 1312, as well as two additional cells 1316 and 1320, are set as filled at block 710. However, at block 740 the computing device 128 also sets an additional set of three cells 1324 as filled. As will be apparent, the cells set to a filled state in the updated model 500-7 do not represent the full height of the items 1304 or 1308, but nevertheless result in a more accurate representation of the actual contents of the container 104.

Following the performance of block 745 (or a negative determination at block 740), the computing device proceeds to block 445, as mentioned earlier.

In some examples, additional processing may be performed by the computing device 128, for example to remove noise from the frame captured at block 410. Noise removal may be performed, for example, before beginning subsequent processing of the frame at block 415.

The systems and methods set out above may provide certain technical advantages over other systems which assess container fullness on the basis of single, independent frames of data, e.g. by capturing one point cloud frame and assessing fullness based on a two-dimensional grid applied to the point cloud. Such systems may be unable to accurately track fullness under conditions such as those illustrated in FIG. 3, or any other conditions under which portions of a container become occluded. The assessment of container fullness based on current and historical data, as implemented by the systems and methods described herein, may enable increased fullness tracking accuracy even under those conditions.

The above description refers to a block diagram of the accompanying drawings. Alternative implementations of the example represented by the block diagram includes one or more additional or alternative elements, processes and/or devices. Additionally or alternatively, one or more of the example blocks of the diagram may be combined, divided, re-arranged or omitted. Components represented by the blocks of the diagram are implemented by hardware, software, firmware, and/or any combination of hardware, software and/or firmware. In some examples, at least one of the components represented by the blocks is implemented by a logic circuit. As used herein, the term "logic circuit" is expressly defined as a physical device including at least one hardware component configured (e.g., via operation in accordance with a predetermined configuration and/or via execution of stored machine-readable instructions) to control one or more machines and/or perform operations of one or more machines. Examples of a logic circuit include one or more processors, one or more coprocessors, one or more microprocessors, one or more controllers, one or more digital signal processors (DSPs), one or more application specific integrated circuits (ASICs), one or more field programmable gate arrays (FPGAs), one or more microcontroller units (MCUs), one or more hardware accelerators, one or more special-purpose computer chips, and one or more system-on-a-chip (SoC) devices. Some example logic circuits, such as ASICs or FPGAs, are specifically configured hardware for performing operations (e.g., one or more of the operations described herein and represented by the flowcharts of this disclosure, if such are present). Some example logic circuits are hardware that executes machine-readable instructions to perform operations (e.g., one or more of the operations described herein and represented by the flowcharts of this disclosure, if such are present). Some example logic circuits include a combination of specifically configured hardware and hardware that executes machine-readable instructions. The above description refers to various operations described herein and flowcharts that may be appended hereto to illustrate the flow of those operations. Any such flowcharts are representative of example methods disclosed herein. In some examples, the methods represented by the flowcharts implement the apparatus represented by the block diagrams. Alternative implementations of example methods disclosed herein may include additional or alternative operations. Further, operations of alternative implementations of the methods disclosed herein may combined, divided, re-arranged or omitted. In some examples, the operations described herein are implemented by machine-readable instructions (e.g., software and/or firmware) stored on a medium (e.g., a tangible machine-readable medium) for execution by one or more logic circuits (e.g., processor(s)). In some examples, the operations described herein are implemented by one or more configurations of one or more specifically designed logic circuits (e.g., ASIC(s)). In some examples the operations described herein are implemented by a combination of specifically designed logic circuit(s) and machine-readable instructions stored on a medium (e.g., a tangible machine-readable medium) for execution by logic circuit(s).

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. A method for tracking container fullness, the method comprising:
   generating a three-dimensional grid of cells representing respective portions of an interior of a container, each cell being smaller than one or more items to be loaded into the container interior and each cell having a status indicator defining an occupancy state of the corresponding portion of the container interior;
   during loading of the one or more items into the container interior from a back of the container to a front of the container:
      maintaining, for each of the cells, a current status indicator,
      controlling a single depth sensor to capture a sequence of point clouds, each point cloud depicting the container interior,
      in response to each point cloud capture in the sequence, generating updated status indicators for the cells, based on (i) the point cloud, and on (ii) the current status indicators,
      replacing the current status indicators with the updated status indicators,
      measuring a current fullness of the container based on the current status indicators, and
      transmitting the current fullness to a computing device for at least one of display of the current fullness, or alert generation associated with the current fullness, wherein the status indicators define, for each cell, one of at least an empty occupancy state and a filled occupancy state, and
   measuring the current fullness includes:
      determining an equivalent volume to the cells having the filled occupancy state; and
      determining a ratio of the equivalent volume to a total container volume.

2. The method of claim 1, wherein measuring the current fullness further includes determining a ratio of cells having the filled occupancy state to a total number of cells.

3. The method of claim 1, wherein generating the updated status indicators includes:
   for each of a plurality of points in a captured point cloud, identifying a corresponding one of the cells; and
   setting the status indicator for the corresponding cell to a filled state.

4. The method of claim 3, wherein generating the updated status indicators further includes:
   setting the status indicator to a filled state for at least one further cell between the corresponding cell and a back of the container.

5. The method of claim 4, wherein the at least one further cell includes a number of cells selected based on a predefined item depth.

6. The method of claim 3, wherein generating the updated status indicators includes:
   identifying a further cell between the corresponding cell and the single depth sensor, and having a status indicator set to the filled state; and
   updating the status indicator of the further cell to an empty state.

7. The method of claim 3, wherein generating the updated status indicators includes:
   identifying a further cell below the corresponding cell and having a status indicator set to an empty state; and
   setting the status indicator of the further cell to a filled state.

8. A system comprising:
   a single depth sensor having a field of view encompassing at least a portion of an interior of a container; and
   a computing device configured to:
      generate a three-dimensional grid of cells representing respective portions of an interior of the container, each cell being smaller than one or more items to be loaded into the container interior and each cell having a status indicator defining an occupancy state of the corresponding portion of the container interior;
      during loading of the one or more items into the container interior from a back of the container to a front of the container:
         maintain, for each of the cells, a current status indicator,
         control the single depth sensor to capture a sequence of point clouds, each point cloud depicting the container interior, in response to each point cloud capture in the sequence, generate updated status indicators for the cells, based on (i) the point cloud, and on (ii) the current status indicators, replace the current status indicators with the updated status indicators, measure a current fullness of the container based on the current status indicators, and transmit the current fullness to a further computing device for at least one of display of the current fullness, or alert generation associated with the current fullness, wherein the status indicators define, for each cell, one of at least an empty occupancy state and a filled occupancy state, and the computing device is configured, to measure the current fullness, to:

determine an equivalent volume to the cells having the filled occupancy state; and determine a ratio of the equivalent volume to a total container volume.

9. The system of claim 8, wherein the computing device is further configured, to measure the current fullness, to determine a ratio of cells having the filled occupancy state to a total number of cells.

10. The system of claim 8, wherein the computing device is configured, to generate the updated status indicators, to:

for each of a plurality of points in a captured point cloud, identify a corresponding one of the cells; and set the status indicator for the corresponding cell to a filled state.

11. The system of claim 10, wherein the computing device is configured, to generate the updated status indicators, to:

set the status indicator to a filled state for at least one further cell between the corresponding cell and a back of the container.

12. The system of claim 11, wherein the at least one further cell includes a number of cells selected based on a predefined item depth.

13. The system of claim 10, wherein the computing device is configured, to generate the updated status indicators, to:

identify a further cell between the corresponding cell and the single depth sensor, and having a status indicator set to the filled state; and update the status indicator of the further cell to an empty state.

14. The system of claim 10, wherein the computing device is configured, to generate the updated status indicators, to:

identify a further cell below the corresponding cell and having a status indicator set to an empty state; and set the status indicator of the further cell to a filled state.

15. A non-transitory computer-readable medium storing instructions executable by a processor of a computing device to:

generate a three-dimensional grid of cells representing respective portions of an interior of a container, each cell being smaller than one or more items to be loaded into the container interior and each cell having a status indicator defining an occupancy state of the corresponding portion of the container interior;

during loading of the one or more items into the container interior from a back of the container to a front of the container:

maintain, for each of the cells, a current status indicator, control a single depth sensor to capture a sequence of point clouds, each point cloud depicting the container interior, in response to each point cloud capture in the sequence, generate updated status indicators for the cells, based on (i) the point cloud, and on (ii) the current status indicators, replace the current status indicators with the updated status indicators, measure a current fullness of the container based on the current status indicators, and transmit the current fullness to a further computing device for at least one of display of the current fullness, or alert generation associated with the current fullness, wherein the status indicators define, for each cell, one of at least an empty occupancy state and a filled occupancy state, and the processor of the computing device is configured, to measure the current fullness, to:

determine an equivalent volume to the cells having the filled occupancy state; and determine a ratio of the equivalent volume to a total container volume.

* * * * *